(12) United States Patent
Takai et al.

(10) Patent No.: US 9,349,980 B2
(45) Date of Patent: May 24, 2016

(54) SCATTERING FILM FOR ORGANIC EL AND ORGANIC EL LIGHT EMITTING DEVICE USING SAME

(75) Inventors: Masashi Takai, Saitama (JP); Toshiaki Ishibashi, Saitama (JP)

(73) Assignee: KIMOTO CO., LTD., Saitama (JP)

( * ) Notice: Subject to any disclaimer, the term of this patent is extended or adjusted under 35 U.S.C. 154(b) by 0 days.

(21) Appl. No.: 14/237,944

(22) PCT Filed: Jul. 31, 2012

(86) PCT No.: PCT/JP2012/069481
§ 371 (c)(1),
(2), (4) Date: Feb. 10, 2014

(87) PCT Pub. No.: WO2013/021865
PCT Pub. Date: Feb. 14, 2013

(65) Prior Publication Data
US 2014/0167029 A1    Jun. 19, 2014

(30) Foreign Application Priority Data
Aug. 11, 2011 (JP) ................... 2011-175471

(51) Int. Cl.
*H01L 51/52* (2006.01)
(52) U.S. Cl.
CPC ........ *H01L 51/5203* (2013.01); *H01L 51/5268* (2013.01); *H01L 2251/5369* (2013.01); *H01L 2251/55* (2013.01)
(58) Field of Classification Search
CPC ............ H01L 51/5203; H01L 51/5268; H01L 2251/5369; H01L 2251/5307; H01L 2251/55
USPC ............................................. 257/40; 524/539
See application file for complete search history.

(56) References Cited

U.S. PATENT DOCUMENTS

| | | | |
|---|---|---|---|
| 2005/0131081 A1* | 6/2005 | Ueno et al. | 516/77 |
| 2005/0142379 A1 | 6/2005 | Juni et al. | |
| 2007/0290607 A1 | 12/2007 | Okada et al. | |
| 2008/0030986 A1* | 2/2008 | Ogawa et al. | 362/231 |
| 2009/0051278 A1* | 2/2009 | Saneto et al. | 313/504 |

(Continued)

FOREIGN PATENT DOCUMENTS

| | | |
|---|---|---|
| JP | 8-315985 A | 11/1996 |
| JP | 2005-063704 A | 3/2005 |

(Continued)

OTHER PUBLICATIONS

Tawaraya et al., JP 2007-188708, machine translation.*

(Continued)

*Primary Examiner* — Peter Bradford
(74) *Attorney, Agent, or Firm* — Bacon & Thomas, PLLC

(57) ABSTRACT

There is provided a scattering film that can be used in organic EL light emitting devices and that not only improves efficiency for light utilization and improves viewing angle dependency, which have conventionally been problems, but also can solve the problem of reflection when lights-off. This scattering film for organic EL is used in organic EL light emitting devices. The scattering film comprises a scattering layer that includes a binder resin and particles having a refractive index different from the binder resin. The average particle size of the particles is 10 μm or less, and the coefficient of variation of the average particle size for the particles is 30% or greater.

20 Claims, 1 Drawing Sheet

(56) References Cited

U.S. PATENT DOCUMENTS

| | | |
|---|---|---|
| 2009/0224660 A1 | 9/2009 | Nakanishi et al. |
| 2010/0183866 A1 | 7/2010 | Fujimoto et al. |
| 2010/0225229 A1* | 9/2010 | Hosoda et al. ............... 313/504 |
| 2010/0330716 A1* | 12/2010 | Tyan et al. ..................... 438/29 |
| 2011/0133237 A1* | 6/2011 | Koike .................. H01L 33/501 257/98 |
| 2011/0298361 A1* | 12/2011 | Matsunaga .......... G02B 5/0242 313/504 |

FOREIGN PATENT DOCUMENTS

| | | |
|---|---|---|
| JP | 2005-190931 A | 7/2005 |
| JP | 2006-107744 A | 4/2006 |
| JP | 2007-035313 A | 2/2007 |
| JP | 2007-188708 A | 7/2007 |
| JP | 2008-243669 A | 10/2008 |
| JP | 2009-110930 A | 5/2009 |
| JP | 2009-216862 A | 9/2009 |
| JP | 2010-170726 A | 8/2010 |

OTHER PUBLICATIONS

Seiji, JP 2007-188708, published Jul. 26, 2007, machine translation from Japanese Patent Office website.*
International Preliminary Report on Patentability (IPRP) dated Feb. 20, 2014 for PCT/JP2012/069481.
International Search Report dated Oct. 9, 2012, for PCT/JP2012/069481.

* cited by examiner

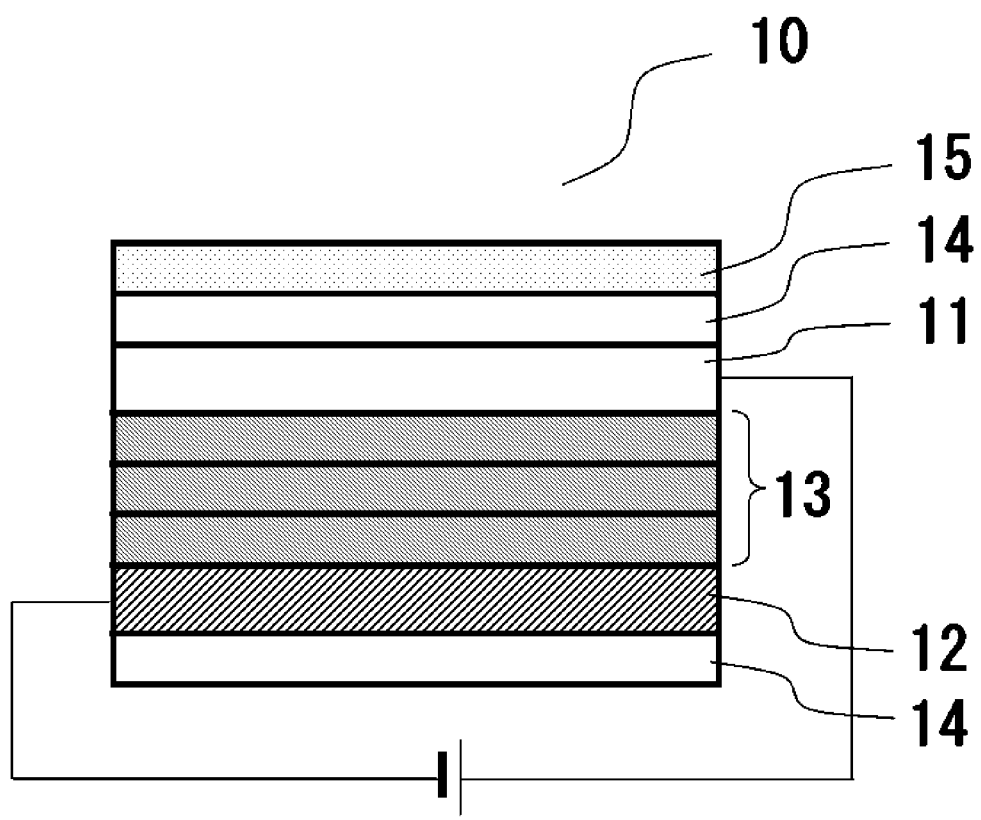

SCATTERING FILM FOR ORGANIC EL AND ORGANIC EL LIGHT EMITTING DEVICE USING SAME

TECHNICAL FIELD

The present invention relates to a scattering film used in an organic EL light emitting device.

BACKGROUND ART

In conventional organic EL light emitting devices, a voltage is supplied to an organic electroluminescence (organic EL) element including a light-emitting layer disposed between an anode (transparent electrode) and a cathode (back electrode) to cause light emission. The organic EL light emitting device has advantages in being light weight, thin, and low power consuming, and is used as a backlight for liquid crystal displays or as a planar illuminating device, for example JP-A-H8-315985.

Although the organic EL light emitting device has the above advantages, it also has the following problems.

Namely, because the organic thin film layers of the organic EL light emitting device, such as the organic light-emitting layer, or a support provided with the organic thin film layers have refractive indexes higher than the refractive index of air, total reflection of the emitted light tends to occur at an interface. Thus, the light utilization efficiency is no more than 20% of the total, meaning that most of the light is lost.

The organic EL light emitting device also has the problem of viewing angle dependency. Specifically, the light-emitting layer of the organic EL light emitting device includes a combination of a red light-emitting layer, a green light-emitting layer, and a blue light-emitting layer. These light-emitting layers have different refractive indexes, so that, when the light-emitting surface of the organic EL light emitting device is viewed at an angle, the light is separated according to wavelength at the interfaces between the light-emitting layers. When the light is separated according to wavelength, an optical path length difference is caused between the light-emitting layers, whereby the hue appears changed depending on the viewing angle. For example, when the organic EL light emitting device is viewed from the front, the optical path length change does not easily occur, and the change in color of the light emitted by the organic EL light emitting device does not easily occur. However, when viewed at an angle, the hue appears changed due to the optical path length change between the light-emitting layers.

As regards the problem of low optical utilization efficiency, proposals include providing a light outcoupling layer of a low refractive index material or placing a specific scattering member on the light outcoupling surface JP-A-2007-35313 and JP-A-2009-110930. However, these technologies do not provide an effective countermeasure for the wavelength separation of light.

Further, when the organic EL light emitting device is turned off, outside scenery or the like may be reflected on the surface of the organic EL light emitting device, adversely affecting the appearance of the surface.

SUMMARY OF THE INVENTION

Thus, there is a need for a design such that the problems of light utilization efficiency, viewing angle dependency, and reflection at lights-off can be eliminated.

The present inventors made the present invention after finding that the problems of light utilization efficiency, viewing angle dependency, and reflection at lights-off can be simultaneously eliminated by providing a scattering film including a specific scattering layer on the light-emitting surface side of the organic EL light emitting device.

Namely, an organic EL scattering film according to the present invention which is used in an organic EL light emitting device includes a scattering layer including a binder resin and particles with a refractive index different from a refractive index of the binder resin. The particles have an average particle size of not more than 10 µm, and the average particle size of the particles has a variation coefficient of not less than 30%.

In an organic EL scattering film according to the present invention, the content of the particles may be preferably 40 to 300 parts by weight with respect to 100 parts by weight of the binder resin.

In an organic EL scattering film according to the present invention, the refractive index of the binder resin and the refractive index of the particles may preferably have a refractive index difference with an absolute value of 0.03 to 0.3.

An organic EL light emitting device according to the present invention includes a pair of electrodes, a light-emitting layer disposed between the pair of electrodes, and a scattering film disposed on a light-emission surface of the electrode on the light-emission side. The scattering film is the scattering film according to the present invention.

According to the above invention, the scattering film used in the organic EL light emitting device includes the scattering layer including the binder resin and the particles with a refractive index different from the refractive index of the binder resin. The particles have an average particle size of not more than 10 µm, and the variation coefficient of the average particle size is not less than 30%. In this way, light utilization efficiency can be increased, and the reflection at the time of lights-off can be prevented while viewing angle dependency is improved.

BRIEF DESCRIPTION OF THE DRAWING

FIG. 1 is a lateral cross sectional view of an example of an organic EL light emitting device according to the present invention.

In the following, an embodiment of an organic EL scattering film (which may be hereafter referred to as "the scattering film") according to the present invention will be described.

The organic EL scattering film according to the present invention may include only a scattering layer, or a scattering layer and a support and other layers. First, the constituent elements of the scattering layer, particularly a binder resin and particles, will be described.

The binder resin contained in the scattering layer of the present invention may include a resin with excellent optical transparency. Examples are thermoplastic resins, thermosetting resins, and ionizing radiation curable resins, such as polyester-based resins, acrylic-based resins, acrylic urethane-based resins, polyester acrylate-based resins, polyurethane acrylate-based resins, epoxy acrylate-based resins, urethane-based resins, epoxy-based resins, polycarbonate-based resins, cellulose-based resins, acetal-based resins, polyethylene-based resins, polystyrene-based resins, polyamide-based resins, polyimide-based resins, melamine-based resins, phenol-based resins, and silicone-based resins. Particularly, thermosetting resins or ionizing radiation curable resins having superior coating hardness and weather resistance are preferable. Among the resins mentioned above, acrylic-based resins may be preferably used from the viewpoint of light resistance and optical characteristics.
}

Preferably, the binder resin includes a hydroxyl group. Specifically, the binder resin may preferably have a hydroxyl value of 40 mg KOH/g or more and more preferably 60 mg KOH/g. When the hydroxyl value is high, high coating hardness can be obtained while the planar shape of the scattering layer is maintained upon coating. In this way, superior durability can be obtained when installed on an organic EL light emitting device without adversely affecting various performance in terms of light utilization efficiency, viewing angle dependency, and anti-reflection performance.

The refractive index of the binder resin differs from the refractive index of the particles, as will be described below. When the binder resin and the particles have different refractive indexes, a refractive index difference is caused between the binder resin and the particles. As a result, the light that has been separated according to wavelength can be scattered in the scattering layer and mixed again, whereby the viewing angle dependency can be eliminated. Preferably, the refractive index of the binder resin may be in the order of 1.4 to 1.65.

The particles contained in the scattering layer according to the present invention are used to form an uneven shape on the scattering layer surface so that the output light utilization efficiency can be increased by enabling the output of the portion of light that has not conventionally been output due to total reflection. The uneven shape also serves to prevent the reflection of outside scenery and the like when the organic EL light emitting device is turned off.

The particles in the scattering layer according to the present invention have the refractive index different from the refractive index of the binder resin. By using the particles having the different refractive index from the refractive index of the binder resin, the refractive index difference can be caused between the binder resin and the particles. As a result, the light separated according to wavelength can be scattered in the scattering layer and then mixed again, whereby the viewing angle dependency can be eliminated.

The particles may include resin particles or inorganic particles. Examples of the resin particles are silicone resin particles, acrylic resin particles, nylon resin particles, styrene resin particles, acrylic styrene resin particles, polyethylene particles, benzoguanamine resin particles, urethane resin particles, and melamine resin particles. Examples of inorganic particles include diamond, titanium oxide, zirconium oxide, lead oxide, lead carbonate, zinc oxide, zinc sulfide, antimony oxide, silica, aluminum hydroxide, barium sulfate, and calcium carbonate. Among others, resin particles may be preferably used from the viewpoint of superior light utilization efficiency. Particularly, among the resin particles, benzoguanamine resin particles may preferably be used from the viewpoint of the ease of obtaining the refractive index difference from the binder resin, and improvement in viewing angle dependency without adversely affecting light utilization efficiency.

Preferably, the refractive index of the particles may be on the order of 1.3 to 3.0. When the refractive index is in such a range, viewing angle dependency can be improved while light utilization efficiency is further increased. Particularly, from the viewpoint of improving light utilization efficiency, a range of 1.3 to 1.7 may be more preferable.

Preferably, the absolute value of the refractive index difference between the refractive index of the binder resin and the refractive index of the particles may be not less than 0.03 at the lower limit, and more preferably not less than 0.04. When the absolute value of the refractive index difference is not less than 0.03, viewing angle dependency can be further improved. Preferably, the upper limit of the absolute value of the refractive index difference is not more than 0.3 and more preferably not more than 0.2. Whether the binder resin or the particles have the higher refractive index does not matter as long as there is the refractive index difference.

The particles have an average particle size of not more than 10 μm. When the particles have such a relatively small average particle size, a number of fine protruding shapes are formed on the surface of the scattering layer to the height on the order of several μm, together with a specific variation coefficient parameter of the average particle size, as will be described below. Thus, the reflection of the outside scenery and the like at the time of lights-off of the organic EL light emitting device can be effectively prevented without adversely affecting the improvements in light outcoupling efficiency and viewing angle dependency. More preferably, the average particle size of the particles may be in a range of 1 to 5 μm. When the average particle size is more than 10 μm, the light from the light-emitting layer may not be appropriately scattered, and viewing angle dependency may become worse. Thus, such an average particle size may not be preferable. When the average particle size is less than 1 μm, too, the light from the light-emitting layer may not be appropriately scattered, whereby viewing angle dependency may become worse. The average particle size according to the present invention refers to the value calculated by the Coulter counter method.

Preferably, the particles may have an oval-spherical or spherical shape, and most preferably a shape close to an exactly spherical shape. When the particles have such a non-indefinite shape, very high dispersibility can be obtained when in the form of a paint, whereby a good plate-like material or coating can be obtained without enlargement of the particles due to secondary agglomeration.

The average particle size of the particles has a variation coefficient of not less than 30%. When the average particle size has such a relatively high variation coefficient, and the scattering layer includes the particles with the relatively small average particle size as described above, the reflection at the time of lights-off of the organic EL light emitting device can be prevented without adversely affecting light outcoupling efficiency or viewing angle dependency. Preferably, the variation coefficient is not less than 40% at the lower limit and not more than 70% at the upper limit.

The content of the particles in the scattering layer relative to the binder resin according to the present invention may depend on the average particle size, the variation coefficient, the refractive index difference between the binder resin and the particles, the thickness of the scattering layer, and the like. From the viewpoint of preventing the reflection at the time of lights-off of the organic EL light emitting device while further improving viewing angle dependency, the content of the particles per 100 parts by weight of the binder resin is preferably not less than 40 parts by weight at the lower limit and more preferably not less than 60 parts by weight. Further, in order to prevent a decrease in light outcoupling efficiency, the content of the particles per 100 parts by weight of the binder resin is preferably not more than 300 parts by weight at the upper limit and more preferably not more than 200 parts by weight.

Particularly, when the absolute value of the refractive index difference between the binder resin and the particles is not less than 0.1, the content of the particles per 100 parts by weight of the binder resin is preferably not less than 40 parts by weight at the lower limit and more preferably not more than 150 parts by weight at the upper limit. Meanwhile, when the absolute value of the refractive index difference between the binder resin and the particles is not more than 0.05, the content of the particles per 100 parts by weight of the binder resin is preferably not less than 150 parts by weight at the lower limit and not more than 300 parts by weight at the upper limit. By thus adopting the resin/particle ratio in accordance with the refractive index difference between the binder resin and the particles, the reflection at the time of lights-off of the organic EL light emitting device can be prevented in a more preferred manner without adversely affecting light utilization efficiency or viewing angle dependency.

The scattering layer may include, in addition to the binder resin and the particles, additives such as a cross-linking agent, a coloring agent, an anti-static agent, a flame retardant, an anti-microbial agent, an anti-fungal agent, a ultraviolet absorbing agent, a light stabilizer, an antioxidizing agent, a plasticizer, a leveling agent, a dispersing agent, a flow control agent, or a defoaming agent, to the extent that the functions of the binder resin and the particles are not adversely affected.

Preferably, the scattering layer may have a thickness of 3 to 15 μM from the viewpoint of better preventing the development of curling (curve) when formed as a scattering film.

While the scattering film according to the present invention is provided with the scattering layer, the scattering layer may be stacked on a support. The support is not particularly limited and may include various types. For example, the scattering film includes a transparent plastic film of one or a mixture of two or more of the following: a polyester-based resin; an acrylic-based resin; an acrylic urethane-based resin; a polyester acrylate-based resin; a polyurethane acrylate-based resin; an epoxy acrylate-based resin; a urethane-based resin; an epoxy-based resin; a polycarbonate-based resin; a cellulose-based resin; an acetal-based resin; a vinyl-based resin; a polyethylene-based resin; a polystyrene-based resin; a polypropylene-based resin; a polyamide-based resin; a polyimide-based resin; a melamine-based resin; a phenol-based resin; a silicone-based resin; a fluorine-based resin; and a cyclic olefin. Among others, a stretched, particularly biaxially stretched, polyethylene terephthalate film may be preferable in view of mechanical strength or dimensional stability. Preferably, in order to improve adhesion with the scattering layer, the surface of the film may be corona-discharge treated or provided with an easily adhesive layer. Preferably, the support may normally have a thickness on the order of 10 to 400 μm.

The surface opposite to the uneven surface of the scattering film according to the present invention may be given antireflection treatment in order to increase light transmittance. Further, an anti-static layer or an adhesive layer may be provided.

When the scattering film of the present invention is formed by coating, the scattering film may be formed by applying a scattering layer coating liquid of materials such as the binder resin and the particles dissolved in an appropriate solvent to the support by a known method, such as a bar coater, a blade coater, a spin coater, a roll coater, a gravure coater, a flow coater, a die coater, spraying, or screen printing, and then drying. The scattering film of a single scattering layer may be formed by forming a scattering layer on the support and then removing the support by peeling.

Next, an organic EL light emitting device according to the present invention will be described. The organic EL light emitting device according to the present invention includes the scattering film of the present invention described above affixed onto the light-emitting surface side; in other respects, the structure may be similar to the structure of the known organic EL light emitting device.

FIG. 1 shows an example of an organic EL light emitting device 10. The organic EL light emitting device 10 includes an organic electroluminescence (organic EL) element. The organic EL element includes an anode (transparent electrode) 11 and a cathode (back electrode) 12 each disposed on supports 14 of a transparent polymer resin, glass, or the like, and a light-emitting layer 13 sandwiched between the anode 11 and the cathode 12. On the support 14 for the anode 11 on the light-emission side, a scattering layer 15 which is the scattering film according to the present invention is disposed.

The transparent electrode 11 may include an electrically conductive metal oxide, such as $SnO_2$, $In_2O_3$, or ITO. The cathode 12 may include a high-reflectivity metal such as Al, Ag, or Mo or an alloy thereof. The films of these electrodes 11 and 12 may be formed by a known process, such as vapor deposition, sputtering, or ion plating.

The material of the light-emitting layer 13 may include known organic light-emitting material or doping material. In order to obtain white light, a plurality of light-emitting layers 13 with different emitting colors (such as a red light-emitting layer, a blue light-emitting layer, and a green light-emitting layer) may be combined. The plurality of light-emitting layers 13 may be combined by stacking a plurality of layers, or by arranging the plurality of light-emitting layers in small divided areas of the light-emitting surface of the light emitting device in a mosaic-like manner. When a plurality of layers is stacked, the transparent electrode may be inserted between adjacent light-emitting layers, and a voltage may be applied to each light-emitting layer. The emission of white light may be realized by combining a light-emitting layer emitting a single color with a phosphor layer. The present invention may be applied to any of the above types of light emitting devices.

The organic EL element may be further provided with a hole injection layer, a hole transport layer, an electron injection layer, an electron transport layer, or a barrier layer, in addition to the light-emitting layer. The material of these layers may include a known material, and the layers may be formed by a known process, such as vapor deposition.

The scattering layer 15 includes a binder resin and particles with a refractive index different from the refractive index of the binder resin. The particles have an average particle size of not more than 10 μm, and the average particle size has a variation coefficient of not less than 30%. The scattering layer 15 may include the scattering film according to the present invention. Preferably, the scattering layer 15 may be disposed on the light-emission side, with the uneven surface formed by the particles providing the light-emitting surface. The scattering film may be adhered to the light-emission side directly or via a transparent adhesive layer or bonding layer. The scattering film may also be formed by directly laminating the materials for the scattering layer on the uppermost layer on the light-emission side by coating, for example.

The organic EL light emitting device according to the present invention is provided with the specific scattering layer on the light-emitting surface side, whereby high light utilization efficiency can be obtained and viewing angle dependency can be improved. Further, the reflection of outside scenery and the like when the organic EL light emitting device is turned off can be prevented.

EXAMPLES

In the following, the present invention will be further described with reference to examples. The "parts" and "%" are with reference to weight unless otherwise specified.

1. Production of Scattering Film

Example 1

A scattering film according to Example 1 was obtained by forming a scattering layer by mixing and stirring a scattering layer coating liquid of the following formula, applying the liquid to a support of polyethylene terephthalate film (Lumirror T60: Toray Industries, Inc.) having a thickness of 100 μm by bar coating such that the thickness after drying was 8 μm, and drying.

<Scattering Layer Coating Liquid According to Example 1>
Acrylic polyol 62 parts
(Acrydic 52-666: DIC Corporation; solid content 50%)
(hydroxyl value 75 mg KOH/g; refractive index 1.49)
Isocyanate-based curing agent 38 parts
(Takenate D110N: Mitsui Chemicals, Inc.; solid content 60%)
Benzoguanamine resin particles 53.8 parts
(Epostar MS: Nippon Shokubai Co., Ltd.; refractive index 1.66)
(Average particle size 3 μm, variation coefficient 56%)
Diluting solvent 115 parts Example 2

A scattering film according to Example 2 was obtained in the same way as in Example 1 with the exception that classification was performed by an air classifier such that the benzoguanamine resin particles in the scattering layer coating liquid had a variation coefficient of 35%.

Example 3

A scattering film according to Example 3 was obtained in the same way as in Example 1 with the exception that the amount of the benzoguanamine resin particles added to the scattering layer coating liquid was changed to 172 parts by weight.

Example 4

A scattering film according to Example 4 was obtained in the same way as in Example 1 with the exception that the benzoguanamine resin particles in the scattering layer coating liquid were changed to acrylic styrene resin particles (Ganz Pearl GS-0401: Ganz Chemical Co.; average particle size 4 μM, variation coefficient 43%, and refractive index 1.51).

Reference Example 5

A scattering film according to Reference Example 5 was obtained in the same way as in Example 1 with the exception that the benzoguanamine resin particles (53.8 parts by weight) in the scattering layer coating liquid were changed to silicone resin particles (KMP590: Shin-Etsu Chemical Co., Ltd.; average particle size 2 μm, variation coefficient not less than 30%, refractive index 1.40) (90.4 parts by weight).

Comparative Example 1

A scattering film according to Comparative Example 1 was obtained in the same way as in Example 1 with the exception that the benzoguanamine resin particles in the scattering layer coating liquid were changed to melamine resin particles (Optbeads 3500M: Nissan Chemical Industries, Ltd.; average particle size 3.5 μm, variation coefficient 4%, refractive index 1.65).

Comparative Example 2

A scattering film according to Comparative Example 2 was obtained in the same way as in Example 1 with the exception that classification was performed by an air classifier such that the benzoguanamine resin particles in the scattering layer coating liquid had a variation coefficient of 28%.

Comparative Example 3

A scattering film according to Comparative Example 3 was obtained in the same way as in Example 1 with the exception that the benzoguanamine resin particles in the scattering layer coating liquid were changed to benzoguanamine resin particles (Epostar L15: Nippon Shokubai Co., Ltd.; average particle size 12.5 μm, variation coefficient 43%, refractive index 1.66).

Comparative Example 4

A scattering film according to Comparative Example 4 was obtained in the same way as in Example 1 with the exception that the benzoguanamine resin particles in the scattering layer coating liquid were changed to acrylic resin particles (Ganz Pearl GM-0407S: Ganz Chemical Co.; average particle size 4 μm, variation coefficient 43%, and refractive index 1.49).

2. Production of Organic EL Light Emitting Device

The scattering films according to Examples 1 to 4, Reference Example 5, and Comparative Examples 1 to 4 were each affixed onto the light-emitting surface of an organic EL light emitting device (ORBEOS CDW-031: OSRAIVI GmbH), obtaining an organic EL light emitting device with the scattering film.

3. Evaluation (1) Light Utilization Efficiency

The organic EL light emitting devices with the scattering films according to Examples 1 to 4, Reference Example 5, and Comparative Examples 1 to 4 were caused to emit light by applying a voltage of 3.5V and a current of 120 mA to measure light emission efficiency (lm/W). For comparison reference, the light emission efficiency (lm/W) of the organic EL light emitting device without the scattering film was also separately measured. The results of the measurement are shown in Table 1.

(2) Viewing Angle Dependency

With regard to the organic EL light emitting devices with the scattering films, the chromaticity (CIE color system (1931)) when the viewing angle was changed from −85° to +85° with respect to the front at 0° was measured by using a luminance and color meter (CS-100: Konika Minolta, Inc.). With respect to chromaticity x and chromaticity y, a difference Δx and a difference Δy between the maximum value (max) and the minimum value (min) were determined according to expressions (1) and (2). Further, a color difference ΔE as an index for evaluating viewing angle dependency was calculated according to expression (3). The color difference ΔE was similarly measured and calculated for the organic EL light emitting device without the scattering film for comparison reference. The results are shown in Table 1.

[Equations 1]

$$\Delta x = x_{max} - x_{min} \tag{1}$$

$$\Delta y = y_{max} - y_{min} \tag{2}$$

$$\Delta E = \sqrt{\Delta x^2 + \Delta y^2} \tag{3}$$

(3) Anti-Reflection Performance

The organic EL light emitting devices with the scattering films according to Examples 1 to 4, Reference Example 5, and Comparative Examples 1 to 4 were turned off, and the reflection of outside scenery on the surface of the organic EL light emitting devices was visually observed. The results are shown in Table 1, where "Excellent" indicates that the outside scenery was not visible at all; "Good" indicates almost no visibility; and "Poor" indicates that the outside scenery was visible.

TABLE 1

|  | Light emission efficiency (lm/W) | Color difference ΔE | Anti-reflection performance |
|---|---|---|---|
| Without scattering film | 7.8 | 0.043 | — |
| Example 1 | 13.5 | 0.009 | Excellent |
| Example 2 | 13.4 | 0.0089 | Good |
| Example 3 | 11.3 | 0.0042 | Good |
| Example 4 | 13.4 | 0.01 | Good |
| Example 5 | 13.5 | 0.012 | Good |
| Comparative Example 1 | 13.3 | 0.0087 | Poor |
| Comparative Example 2 | 13.4 | 0.0088 | Poor |
| Comparative Example 3 | 13.5 | 0.016 | Good |
| Comparative Example 4 | 13.4 | 0.018 | Good |

As will be seen from the results shown in Table 1, because the scattering film according to the present invention includes the scattering layer containing the binder resin and the particles with a refractive index different from the refractive index of the binder resin, where the average particle size of the particles is not more than 10 μm and the variation coefficient of the average particle size is not less than 30%, the organic EL light emitting devices using the scattering film were excellent in terms of light utilization efficiency, viewing angle dependency, and anti-reflection performance.

Particularly, the organic EL light emitting device with the scattering film according to Example 1, in which the variation coefficient of the average particle size of the particles in the film was in the range of 40% to 70%, the content of the particles with respect to the binder resin was in the range of 40 to 150 parts by weight, and the absolute value of the refractive index difference between the binder resin and the particles was not less than 0.1, was superior in anti-reflection performance without adversely affecting light utilization efficiency or viewing angle dependency.

Meanwhile, with regard to the scattering films according to Comparative Examples 1 and 2, because the variation coefficient of the average particle size of the particles was less than 30%, the organic EL light emitting devices with the scattering films had inferior anti-reflection performance. With regard to the scattering film according to Comparative Example 3, because the average particle size of the particles used was more than 10 μm, the organic EL light emitting device with the scattering film was inferior in viewing angle dependency. With regard to the scattering film according to Comparative Example 4, because there was no refractive index difference between the difference binder resin and the particles, the organic EL light emitting device with the scattering film was inferior in viewing angle dependency.

The invention claimed is:

1. A scattering film used in an organic EL light emitting device, the scattering film comprising a scattering layer including a binder resin and particles with a refractive index different from a refractive index of the binder resin, wherein:
   the particles have an average particle size of not less than 3 μm and not more than 10 μm;
   a particle size of the particles has a variation coefficient of not less than 40%; and
   wherein the particle size means the particle diameter.

2. The organic EL scattering film according to claim 1, wherein the content of the particles is 40 to 300 parts by weight per 100 parts by weight of the binder resin.

3. The organic EL scattering film according to claim 2, wherein the refractive index of the binder resin and the refractive index of the particles have a refractive index difference with an absolute value of 0.03 to 0.3.

4. The organic EL scattering film according to claim 3, wherein:
   the absolute value of the refractive index difference between the refractive index of the binder resin and the refractive index of the particles is not less than 0.1; and
   the content of the particles per 100 parts by weight of the binder resin is not less than 40 parts by weight and not more than 150 parts by weight.

5. The organic EL scattering film according to claim 4, wherein:
   the binder resin is an acrylic-based resin; and
   the particles are particles of a resin selected from a benzoguanamine resin, an acrylic styrene resin, and a silicone resin.

6. An organic EL light emitting device comprising:
   a pair of electrodes;
   a light-emitting layer disposed between the pair of electrodes; and
   a scattering film disposed on a light-emission surface of the light-emission-side electrode of the pair of electrodes,
   wherein the scattering film is the scattering film according to claim 1.

7. An organic EL light emitting device comprising:
   a pair of electrodes;
   a light-emitting layer disposed between the pair of electrodes; and
   a scattering film disposed on a light-emission surface of the light-emission-side electrode of the pair of electrodes,
   wherein the scattering film is the scattering film according to claim 2.

8. An organic EL light emitting device comprising:
   a pair of electrodes;
   a light-emitting layer disposed between the pair of electrodes; and
   a scattering film disposed on a light-emission surface of the light-emission-side electrode of the pair of electrodes,
   wherein the scattering film is the scattering film according to claim 3.

9. An organic EL light emitting device comprising:
   a pair of electrodes;
   a light-emitting layer disposed between the pair of electrodes; and
   a scattering film disposed on a light-emission surface of the light-emission-side electrode of the pair of electrodes,
   wherein the scattering film is the scattering film according to claim 4.

10. An organic EL light emitting device comprising:
    a pair of electrodes;
    a light-emitting layer disposed between the pair of electrodes; and
    a scattering film disposed on a light-emission surface of the light-emission-side electrode of the pair of electrodes, wherein the scattering film is the scattering film according to claim 5.

11. The organic EL scattering film according to claim 1, wherein the refractive index of the binder resin and the refractive index of the particles have a refractive index difference with an absolute value of 0.03 to 0.3.

12. The organic EL scattering film according to claim 11, wherein:
the absolute value of the refractive index difference between the refractive index of the binder resin and the refractive index of the particles is not less than 0.1; and
the content of the particles per 100 parts by weight of the binder resin is not less than 40 parts by weight and not more than 150 parts by weight.

13. The organic EL scattering film according to claim 1, wherein:
the binder resin is an acrylic-based resin; and
the particles are particles of a resin selected from a benzoguanamine resin, an acrylic styrene resin, and a silicone resin.

14. The organic EL scattering film according to claim 2, wherein:
the binder resin is an acrylic-based resin; and
the particles are particles of a resin selected from a benzoguanamine resin, an acrylic styrene resin, and a silicone resin.

15. The organic EL scattering film according to claim 3, wherein:
the binder resin is an acrylic-based resin; and
the particles are particles of a resin selected from a benzoguanamine resin, an acrylic styrene resin, and a silicone resin.

16. The organic EL scattering film according to claim 1, wherein the refractive index difference is not less than 0.1 and the content of the particles is 40 to 150 parts by weight per parts by weight of the binder resin.

17. The organic EL scattering film according to claim 1, wherein the particles have an average particle size of about 3 μm.

18. A scattering film used in an organic EL light emitting device, the scattering film comprising a scattering layer consisting essentially of a binder resin and particles with a refractive index different from a refractive index of the binder resin, wherein:
the particles have an average particle size of not less than 3 μm and not more than 10 μm;
a particle size of the particles has a variation coefficient of not less than 40%; and
wherein the particle size means the particle diameter.

19. A scattering film used in an organic EL light emitting device, the scattering film comprising a scattering layer comprising a binder resin and a single set of particles with a refractive index different from a refractive index of the binder resin, wherein:
the single set of particles has an average particle size of not less than 3 μm and not more than 10 μm;
a particle size of the single set of particles has a variation coefficient of not less than 40%; and
wherein the particle size means the particle diameter.

20. The scattering film according to claim 19, wherein the scattering layer consists essentially of the binder resin and the single set of particles, and wherein the particle size has a variation coefficient of not more than 70%.

* * * * *